United States Patent
Hewson

(10) Patent No.: US 10,197,601 B2
(45) Date of Patent: Feb. 5, 2019

(54) HIGH BANDWIDTH ROGOWSKI TRANSDUCER WITH SCREENED COIL

(71) Applicant: POWER ELECTRONIC MEASUREMENTS LTD, Nottingham, Nottinghamshire (GB)

(72) Inventor: Christopher Rene Hewson, Beeston Nottingham (GB)

(73) Assignee: POWER ELECTRONIC MEASUREMENTS LTD, Long Eaton (GB)

( * ) Notice: Subject to any disclaimer, the term of this patent is extended or adjusted under 35 U.S.C. 154(b) by 167 days.

(21) Appl. No.: 15/110,301

(22) PCT Filed: Dec. 23, 2014

(86) PCT No.: PCT/EP2014/079269
§ 371 (c)(1),
(2) Date: Jul. 7, 2016

(87) PCT Pub. No.: WO2015/104189
PCT Pub. Date: Jul. 16, 2015

(65) Prior Publication Data
US 2016/0327592 A1    Nov. 10, 2016

(30) Foreign Application Priority Data

Jan. 7, 2014 (GB) .................................. 1400197.8

(51) Int. Cl.
*G01R 1/20* (2006.01)
*G01R 15/18* (2006.01)
*H01F 27/28* (2006.01)

(52) U.S. Cl.
CPC ....... *G01R 15/181* (2013.01); *H01F 27/2885* (2013.01)

(58) Field of Classification Search
USPC ......................................................... 324/127
See application file for complete search history.

(56) References Cited

U.S. PATENT DOCUMENTS 6,614,218 B1 * 9/2003 Ray ..................... G01R 15/181
                                                324/117 R

FOREIGN PATENT DOCUMENTS

CN              101126785 A  *  2/2008  ........... G01R 19/165

OTHER PUBLICATIONS

Cooper "On the High-Frequency Response of a Rogowski Coil",J. Nucl. Energy, Pt. C, Sep. 1, 1963 (Sep. 1, 1963), pp. 285-289, XP055174899, Retrieved from the Internet: URL:http://www.osti.gov/energycitations/product.biblio.jsp? in view of Caixin et al. CN101126785A (hereinafter referred to as Caixin).*
Jan. 23, 2018 Espacenet English Machine Translation of Caixin et al. CN101126785A (Feb. 2008).*

* cited by examiner

*Primary Examiner* — Melissa Koval
*Assistant Examiner* — Courtney McDonnough
(74) *Attorney, Agent, or Firm* — The Concept Law Group, P.A.; Scott D. Smiley

(57) ABSTRACT

A current measuring device is disclosed, comprising: an electrically conductive coil having a first end and a second end; a first screen surrounding the coil and arranged to provide a current path from the second end of the coil to a location proximal to the first end of the coil; and a second screen surrounding the first screen and the coil.

11 Claims, 10 Drawing Sheets

HIGH BANDWIDTH ROGOWSKI TRANSDUCER WITH SCREENED COIL

FIELD OF THE INVENTION

This disclosure relates to current measuring devices using a Rogowski coil. It relates in particular to the fitting of one or more electrostatic screens or shields around the coil to prevent interference with the current measurement due to high frequency voltages or voltage transients on conductors in close proximity to the coil.

The principle of operation of Rogowski transducers is well known. Details of the design and operation of Rogowski transducers can be found for example in "*Wide bandwidth Rogowski current transducers—Part 1: The Rogowski Coil*" European Power Electronics Journal Vol 3 No 1 March 1993 pp 51-59 by W F Ray & R M Davis and in "*Wide bandwidth Rogowski current transducers—Part 2: The Integrator*" European Power Electronics Journal Vol 3 No 2 June 1993 pp 116-122, by W F Ray.

In general terms a Rogowski transducer comprises a Rogowski coil and an integrator. A Rogowski coil is a coil having a substantially uniform turns density of N (turns/m) wound on a structure referred to herein as a former. The former comprises a non-magnetic material, typically plastic, of cross sectional area A (m$^2$), and the coil is arranged to form a substantially closed loop. The coil has a plurality of turns. In order to measure the value of a current I (Amps) in an electrical conductor, the Rogowski coil is placed around the conductor in order to induce a voltage E (V) in the coil. The induced voltage in the coil is proportional to the rate of change of the measured current dI/dt according to the equation $$E = \mu \cdot NA \frac{dI}{dt} = H \frac{dI}{dt} \quad (1)$$

where H=μ·NA is the coil sensitivity (Vs/Amp) and μ is the magnetic permeability of the former material (normally $4\pi 10^{-9}$ Henry/m).

One end of the coil is normally returned to the other end by means of a wire inside the coil running along the central axis of the coil. The end of this wire and the other coil end constitute two terminals for the coil which are connected to an integrator such that the output voltage $V_{out}$ from the integrator is given by $$V_{out} = \frac{1}{T_I} \int E_1 \cdot dt \quad (2)$$

where $T_I$ is the integrator time constant and $E_1$ is the coil terminal voltage.

The terminal voltage $E_1$ is generally substantially the same as the induced voltage E. Hence the overall transducer output voltage $V_{out}$ is instantaneously proportional to the measured current I according to the relationship $$V_{out} = \frac{H}{T_I} I \quad (3)$$

The coil winding constitutes a forward path and the centrally situated wire a return path for the coil. The coil return path follows the geometric mean of the forward path so as to eliminate any net magnetic loop in the plane of the coil. If this were not so, currents in conductors outside the coil loop would also affect the measurement of the desired current.

Return path compensation is a fundamental requirement of accurate Rogowski coil implementation and is described in "Machinable Rogowski Coil, Design and Calibration" IEEE Transactions on Instrumentation & Measurement, Vol 45 No 2 April 1996 pp 511-515, by J D Rambos. There are other arrangements which achieve this aim such as having two windings, one inside the other, one providing a forward path for the coil and the other a return path.

A further source of measurement error is the presence of voltages on external conductors close to the Rogowski coil. If the voltages have relatively high rates of change then, due to the capacitive coupling between an external conductor and the coil, displacement currents will be injected into the coil and will be integrated thereby causing an error in the measurement voltage $V_{out}$. To reduce or eliminate this error a screen is generally fitted around the coil as described in "*The effect of electrostatic screening of Rogowski coils for wide-bandwidth current measurement in power electronic applications*", IEEE Power Electronic Specialists Conference Aachen, Germany, June 2004 pp 1143-48, by C R Hewson and W F Ray.

The screen should not constitute a shorted turn around the coil since, at higher frequencies, voltages and currents will be induced in the screen by the current to be measured which will result in a significant reduction in high-frequency bandwidth. Hence some form of gap or insulation is preferable in the screen. Furthermore, to be effective the screen should have a relatively low impedance, otherwise voltages will be created in the screen which are capacitively coupled to the coil.

A disadvantage in fitting a screen to the coil is that it increases the coil capacitance. This is particularly true if the overall coil cross-section diameter is restricted so as to enable the coil to be used in compact electrical equipment. To provide room for the screen for a given overall diameter, the coil diameter must be reduced (compared with the unscreened coil) and the capacitance between the coil and the inner return conductor is therefore increased, in addition to the capacitance between the coil and the screen.

The increased capacitance results in a decrease in coil bandwidth. This can be compensated by decreasing the coil turns density so as to decrease the coil inductance. This reduces the sensitivity H of the coil and therefore reduces the signal to noise ratio for the overall Rogowski transducer.

An alternative arrangement is to eliminate one source of coil capacitance by eliminating the central return conductor and using the screen as a return conductor, as described in "*On the high-frequency response of a Rogowski coil*" Journal of Nuclear Energy Part C, 1963, Vol. 5, pp 285 to 289, by J Cooper. This also has the advantage of making the coil easier to construct, particularly when the coil cross-section diameter is small.

The use of a screen as the return conductor has some disadvantages. A first disadvantage relates to how the screen is connected to the coil and integrator. Since the screen carries the signal current it must be connected to the input of the integrator, generally to the input that is grounded so that the displacement current due to capacitive coupling to external high voltage transients will flow to ground. However in practice the ground plane of the integrator is likely to have some impedance and as a result some interference is still caused by the external voltage transients.

A further disadvantage is that in practice it is difficult to construct a perfect screen which has low impedance. For example, the screen may be a helically wound copper strip but to avoid the shorted turn effect a gap between the turns should be present. This gap allows some of the interference current to pass through to the coil. Furthermore, the screen has inductance due to the helical winding, which has significant effects at high frequency.

SUMMARY OF THE INVENTION

To enable Rogowski transducers to be used for current measurement in power electronic equipment the Rogowski coil is preferably thin (i.e. having a small cross-section diameter) so that it can be inserted in geometrically cramped situations and furthermore that the Rogowski device has a high bandwidth to measure very fast current changes. This imposes constraints on the coil design and it is an objective of this invention to provide a Rogowski coil design which achieves the required screening whist at the same time providing a high bandwidth for the current measurement.

The inventor has appreciated that a disadvantage lies in using the screen for the dual purpose of being the return conductor for the signal as well as being the path to ground for the interference current.

An invention is set out in the independent claims. Optional features are set out in the dependent claims.

In this application the term screen is used and it is understood that the term shield may equally be applied. Furthermore the term transducer is used for a measuring device.

The inventor has identified that the above-stated disadvantage can be addressed by using two separate screens: an outer screen for by-passing the interference current to ground and an inner screen for acting as the coil return path. Although this adds to the complexity and cost of the coil, it gives several advantages. Not only does the double screening reduce the interference but also the screens do not both have to be connected to the input of the integrator.

At first it may appear that using two screens will significantly increase the coil capacitance, but this has been found not to be the case. The capacitance between the two screens does not affect the behaviour of the Rogowski transducer. It is true that the inner screen will have a smaller diameter than it would have if only one screen were used (for a given overall diameter), but the difference can be relatively small and in any case this can be compensated by using a smaller diameter coil with a lower inductance so as to maintain a high bandwidth.

In an aspect, there is provided a current measuring device comprising: an electrically conductive coil having a first end and a second end; a first screen; and a second screen.

In some embodiments, the coil forms a loop, with the first end being located proximal to the second end. In some embodiments, the loop is opened or openable to form a gap between the first end and the second end. In some embodiments, the conductive coil comprises a Rogowski coil. In some embodiments, the Rogowski coil comprises any of: a clip-around coil, a closed-loop coil, a printed circuit Rogowski coil and a coil wound on a non-conductive former.

In some embodiments, the first screen is arranged to provide a current path from the second end of the coil to a location proximal to the first end of the coil. In some embodiments, a first end of the first screen is proximal to the first end of the coil, and a second end of the first screen is proximal to the second end of the coil. In some embodiments, the second end of the first screen is electrically connected to the second end of the coil. In some embodiments, apart from the connection between the second end of the first screen and the second end of the coil, the first screen is electrically insulated from the coil. In some embodiments, the first end of the first screen is electrically connected to ground. In some embodiments, the first screen comprises a helical strip.

In some embodiments, a first end of the second screen is proximal to the first end of the coil, and a second end of the second screen is proximal to the second end of the coil. In some embodiments, the second screen is electrically connected to ground. In some embodiments, the second screen is electrically insulated from the first screen and the coil. In some embodiments, the second screen comprises a braid.

In some embodiments, the first screen and/or the second screen is electrically conductive. In some embodiments, the first screen and/or the second screen is an electrostatic screen. In some embodiments, the first screen and/or the second screen is a shield. In some embodiments, the first screen and/or the second screen is arranged to reduce capacitive coupling from external conductors to the coil.

In some embodiments, the first screen surrounds the coil. In some embodiments, the second screen surrounds the first screen and the coil. In some embodiments, an inner insulation is situated between the coil and the first screen. In some embodiments, an intermediate insulation is situated between the first screen and the second screen. In some embodiments, an outer insulation surrounds the second screen.

In some embodiments, the current measuring device comprises a former, around which the coil is situated. In some embodiments, the former extends from the first end to the second end of the coil. In some embodiments, a first end of the former is proximal to the first end of the coil, and a second end of the former is proximal to the second end of the coil. In some embodiments, the former is substantially non-magnetic. In some embodiments, the former is substantially non-conductive. In some embodiments, the former has a uniform cross-section along its length. In some embodiments, the former comprises a former outer surface having a circular cross-section. In some embodiments, the former defines a central axis along its length. In some embodiments, any or all of whichever is present out of the first screen, the second screen, the inner insulation, the intermediate insulation and the outer insulation is concentric about the central axis and/or has an annular cross-section. In some embodiments, the former (including its central axis) forms a loop. In some embodiments, the loop is openable and closable to enable an electrical conductor for carrying an electrical current to be measured to extend through the loop.

In some embodiments, the current measuring device comprises an electrical integrator. In some embodiments, the integrator is an operational amplifier integrator. In some embodiments, a first input terminal of the integrator is electrically connected to the first end of the conductive coil. In some embodiments, a second input terminal of the integrator is electrically connected to the first screen. In some embodiments, a part of the first screen in closest connection to the second input terminal of the integrator is located proximal to the first end of the coil. In some embodiments, the part of the first screen is the first end of the first screen. In some embodiments, the second input terminal of the integrator is electrically connected to the first end of the first screen. In some embodiments, the second input terminal of the integrator is electrically connected to ground. In some embodiments, the integrator is arranged to provide an output voltage that is substantially proportional to the integral with respect to time of the voltage difference between the first input terminal of the integrator and the second input terminal of the integrator.

In an aspect, there is provided a method of measuring current passing through an electrical conductor using the current measuring device of any of the above aspects and/or embodiments.

In an aspect, there is provided a device, system, apparatus or method substantially as described herein or shown in the appended drawings.

BRIEF DESCRIPTION OF THE DRAWINGS

Specific examples and embodiments are now described with reference to the drawings, in which.

DETAILED DESCRIPTION

Figure 1:
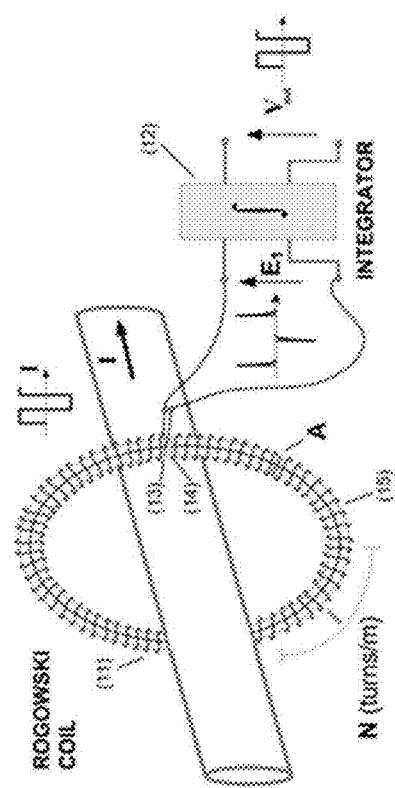
FIG. 1 shows schematically a Rogowski transducer comprising a Rogowski coil and electrical integrator.

While the specification concludes with claims defining the features of the invention that are regarded as novel, it is believed that the invention will be better understood from a consideration of the following description in conjunction with the drawing figures, in which like reference numerals are carried forward. It is to be understood that the disclosed embodiments are merely exemplary of the invention, which can be embodied in various forms.

FIG. 1 shows schematically a Rogowski transducer comprising a Rogowski coil and an electrical integrator. The coil 11 is wound on a plastic former. The former is toroidal, with a circular cross-section, forming a ring torus. The toroidal loop of the former has an opening and is thereby arranged to form an openable and closable loop. When the coil 11 is wound on the former, this is referred to as a "clip-around" coil. The loop of the former can be opened in order for the loop to enclose or surround a conductor passing through the loop, with the loop subsequently being closed with the conductor inside the loop for operation. The coil winding has a fixed end 13 and a free end 14. The fixed end 13 and the free end 14 are situated on respective sides of the opening of the former, with the coil extending around the former from one side of the opening to the other, leaving a gap across the opening. The fixed end 13 is connected to an integrator 12. The free end 14 is returned to the fixed end 13 using a wire 15 situated in a hole along the central axis of the former (in the centre of the circular cross-section) so as to provide return path compensation as described above.

The Rogowski transducer behaviour is represented by equations (1) to (3) set out above. The current waveform shown in FIG. 1 is a square wave. As the skilled reader will appreciate, this is convenient for illustrating the basic operation of the Rogowski coil but in practice this waveform could be of any shape and/or could comprise discontinuous pulses.

Figure 2:
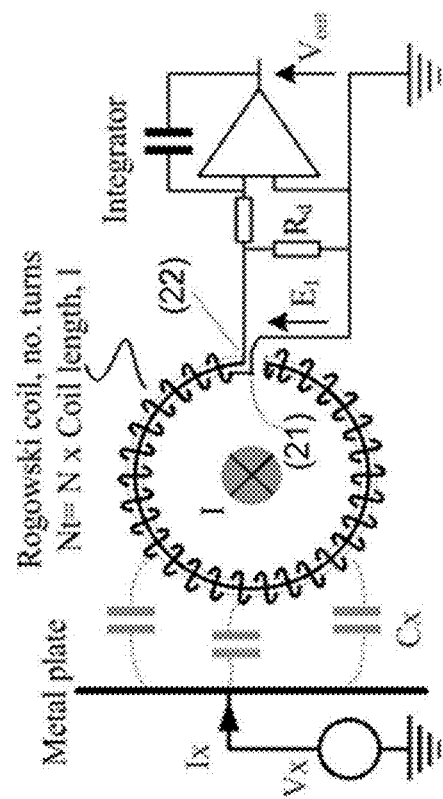
FIG. 2 also shows schematically a Rogowski transducer comprising a Rogowski coil and electrical integrator, and in addition shows an adjacent metal plate with an AC voltage and with capacitive coupling to the coil.

The susceptibility of a Rogowski transducer to interference is illustrated by FIG. 2, which shows a Rogowski coil such as in FIG. 1 surrounding a conductor carrying a current I in the vicinity of a metal plate subjected to a high frequency AC voltage $V_x$ with respect to ground. The Rogowski coil is terminated with an appropriate damping resistor $R_d$ and is connected to a grounded integrator to provide an output voltage $V_{out}$. The end of the coil winding 21 is normally connected to the integrator ground and the end of the return conductor 22 to the integrator input, although these connections could be reversed. Due to the capacitive coupling $C_x$ between the metal plate and the coil, an interference current $I_x$ flows through the coil either to its grounded end or to the integrator input.

For a sinusoidal voltage $V_x$ and an evenly distributed capacitive coupling $C_x$ it may be shown for a single layer closely packed coil that the equivalent error current $I_e$ (superimposed on the current I to be measured) is given by $$I_e = \pi \cdot f \cdot C_x \cdot N_t \cdot V_x \qquad (4)$$

where f is the frequency and $N_t$ is the total coil turns. At high frequencies and voltages, the error current can be significant when trying to measure relatively small currents. For example with f=3 MHz, $C_x$=10 pF, $N_t$=1000 and $V_x$=300 V, the equivalent error current $I_e$=28 A.

With discontinuous voltage transients of high dV/dt the error current appears as a transient disturbance on the measured current waveform.

A typical integrator circuit is shown in FIG. 2. Suitable integrator circuits will be known to the skilled reader and can be of analogue, inverting or non-inverting, or of digital form. The inverting analogue integrator shown in FIG. 2 would also have additional components to limit the low frequency gain of the integrator (such as for example a resistor connected across the integrator capacitor). For simplicity these components are not shown. The terminating resistance $R_d$ should be substantially the same as the characteristic impedance of the coil, as will also be known to those skilled in the art.

Figure 3:
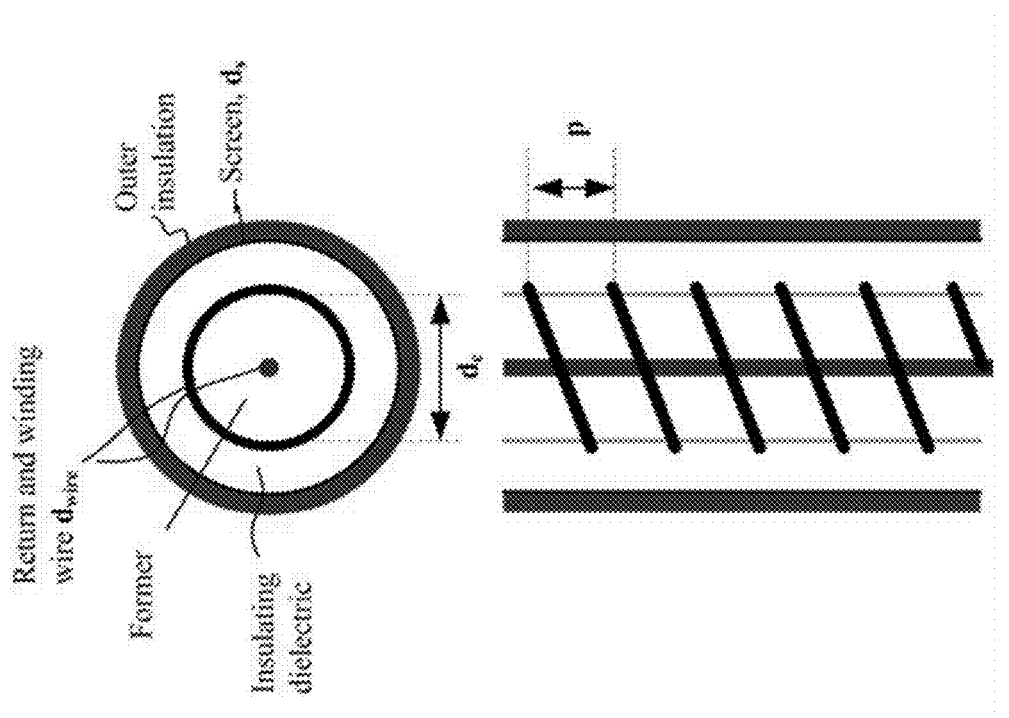
FIG. 3 shows a Rogowski coil surrounded by a conductive screen and with a central return conductor.

As previously stated, the effects of voltage interference can be reduced by fitting a screen to the coil. A screen is shown in FIG. 3. Preferably, the screen completely surrounds the coil and any coupling capacitance from external conductors terminates on the screen rather than the coil. The Rogowski coil is shown for convenience as a loosely packed winding (i.e. the winding pitch p is greater than the wire diameter $d_{wire}$), but it could alternatively be closed packed with each turn touching the next.

Figure 4:
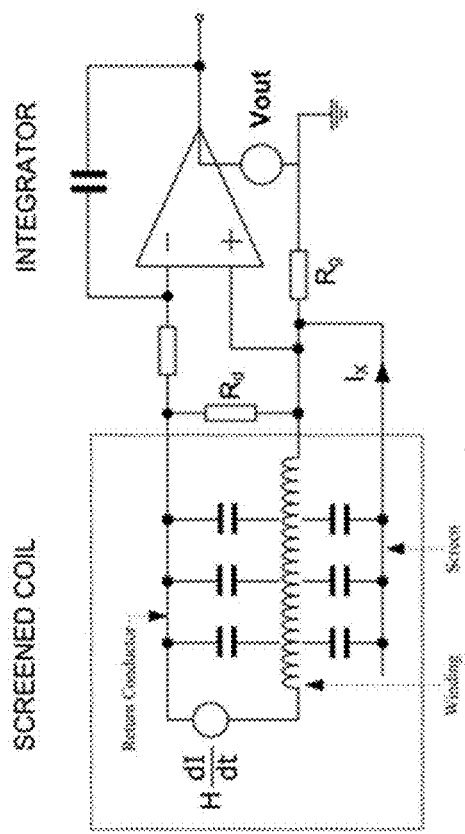
FIG. 4 shows an equivalent circuit for a screened Rogowski coil and its connection to an integrator.

FIG. 4 illustrates the typical connection of the Rogowski coil and the screen to the integrator. Preferably, the screen is connected to ground at the fixed end of the coil and hence the interference current $I_x$ flows through the screen to ground and the integrator is not affected. The voltage induced in the coil due to the current being measured appears at the fixed end of the coil between the coil end and the inner return conductor, as shown in FIG. 1.

However, in practice there is some ground plane resistance $R_g$ between the input to the integrator and the output. There is therefore some common mode path for the coil signal and for the disturbance current $I_x$ which causes interference on the output, albeit reduced by the effect of the screen.

Figure 5:
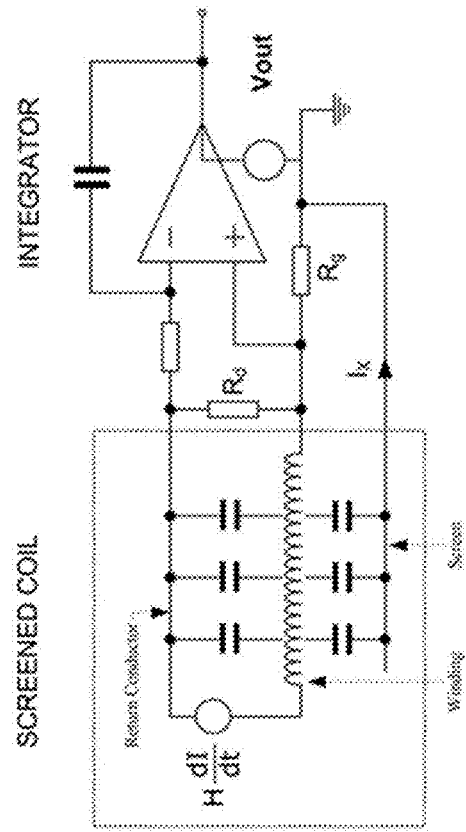
FIG. 5 shows an alternative equivalent circuit for a screened Rogowski coil and its connection to an integrator.

FIG. 5 shows an improved connection of the Rogowski coil to the integrator. In this case, the screen connection is made at the grounded output terminal of the integrator and the interference due to $R_g$ is avoided.

As stated in the introduction, a disadvantage of fitting a screen is that the distributed capacitance of the coil increases. Referring to FIG. 3, assume the wire diameter $d_{wire}$ and the screen diameter $d_s$ are both fixed. If a screen were not used, the coil turn diameter could be made equal to $d_s$ without increasing the thickness of the Rogowski coil. The capacitance $C_c$ between the coil and the inner wire return conductor would then depend on the ratio $d_s/d_{wire}$— the larger the ratio the smaller the capacitance.

Consider then the effect of introducing the screen. The coil turn diameter $d_c$ must be reduced giving a greater value for $C_c$. Furthermore, there is an additional capacitance $C_s$ between the coil and the screen depending on the ratio $d_s/d_c$, and $C_s$ is generally substantially greater than $C_c$.

The bandwidth $f_B$ of the coil is approximately given by $$f_B = 1/\sqrt{2\pi \cdot L(C_c + C_s)} \quad (5)$$

To maintain the same bandwidth with the screen present it is therefore necessary to reduce the coil inductance, L. This has the disadvantage of reducing the sensitivity H of the coil and hence reducing the signal to noise ratio of the transducer.

The capacitance can be reduced by dispensing with the inner return conductor and instead using the screen as the return conductor. This screen is then connected to the input of the integrator and not to the grounded output terminal of the integrator as in FIG. 5.

Figure 6:
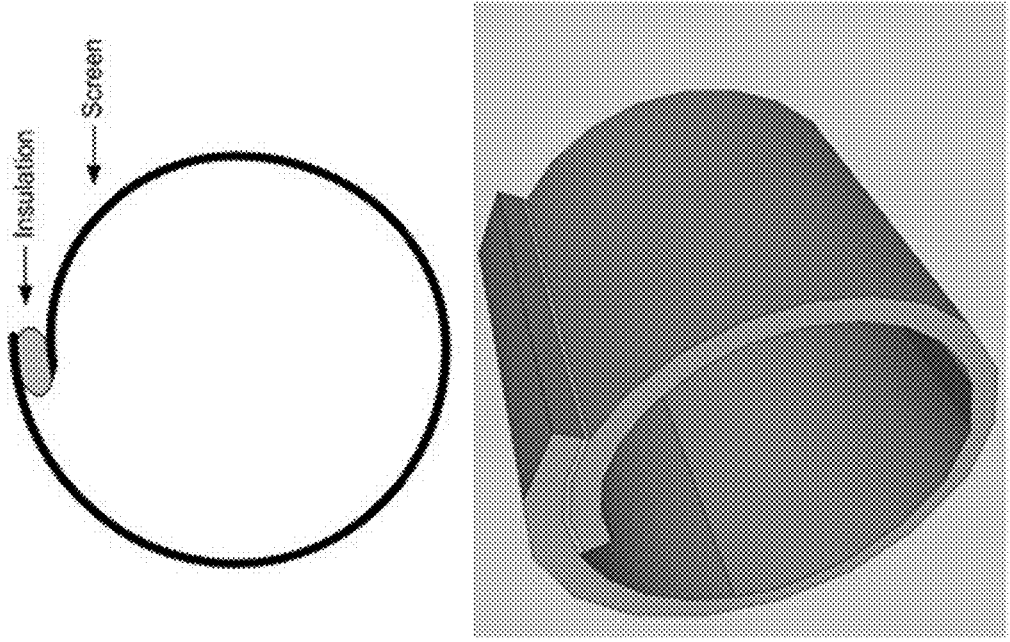
FIG. 6 shows a snail type screen.

In practice, the ideal screen cannot be fulfilled. It is not permitted for the screen to constitute a short circuit turn around the coil, as this would impair the operation of the coil. Three possibilities for the construction of a practical screen are now described:

(1) A snail screen. The snail screen is wrapped around the coil but there is an overlap with insulation situated within the overlap, as shown in FIG. 6. This overcomes the problem of the short circuit turn but curtails the ability of the coil to be bent round in a loop without the screen becoming buckled.

Figure 7:
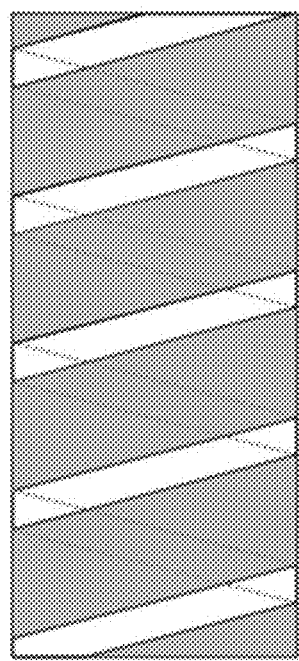
FIG. 7 shows a helical screen.

(2) A helical screen. The helical screen comprises a copper strip which is wound around the coil in a helix as shown in FIG. 7. This overcomes the problem of bending the coil but gives two disadvantages. Firstly, the screen has gaps along each side of the strip, which means that there is some capacitive coupling to the coil underneath, albeit reduced. Secondly, the screen has some inductance due to the helical turns and therefore at high frequency will not provide a low impedance path to ground.

Figure 8:
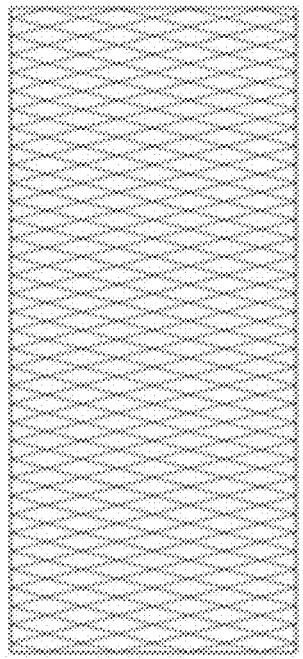
FIG. 8 shows a braid screen.

(3) A braid screen. A braid screen is shown in FIG. 8. Braid is commonly used for screening co-axial cables for communications applications. However, the braid so used is not suitable for screening Rogowski coils since such braid is not insulated and would make a shorted turn around the Rogowski coil. In order to provide acceptable screening for a Rogowski coil, all of the strands of the braid are isolated from each other and are only connected together at one or both of the ends of the screen.

Another possibility for a screen is to use a flattened braid (which need not be insulated) in a helical winding such as that used in the helical screen, instead of the copper strip.

To overcome the disadvantages described above, in some embodiments two screens are used. An inner screen is arranged to provide a return path for the Rogowski coil and an outer screen is arranged to eliminate or reduce capacitive coupling from external conductors to the coil.

Figure 9:
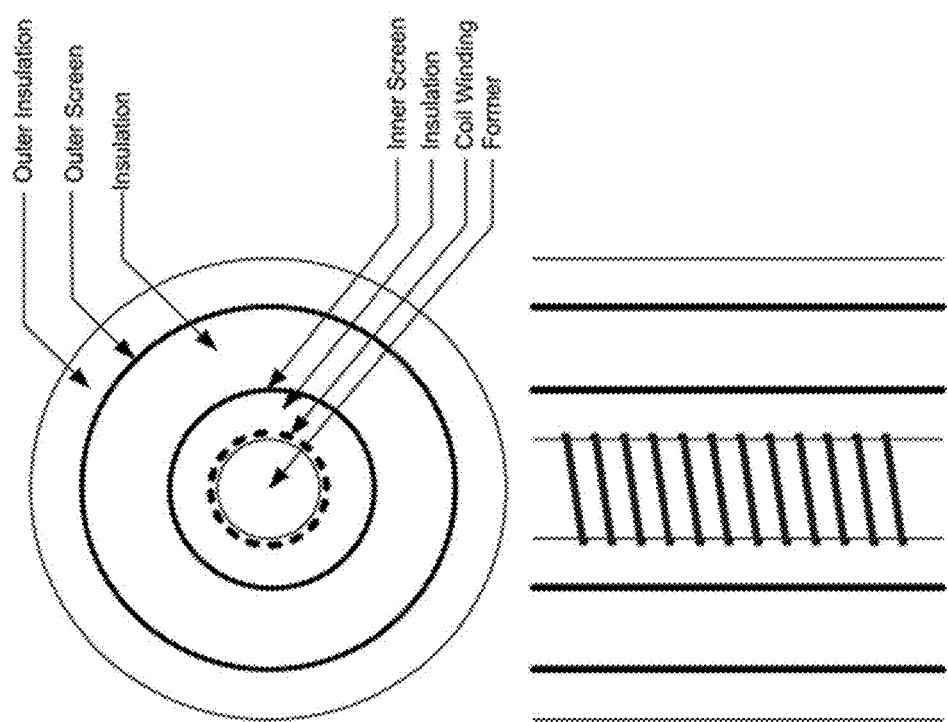
FIG. 9 shows a Rogowski coil surrounded by two conductive screens and without a central return conductor.

A cross-section of a Rogowski coil according to these embodiments is shown in FIG. 9. These embodiments are similar to the above description, except where is apparent from details of these embodiments. These embodiments have an equivalent circuit similar to FIG. 4, but with an additional screen and no central return wire.

The former is torus-shaped, as described above. In these embodiments it is solidly filled. There is no return path running through the centre of the cross-section, as described above. The cross-section of the former is a circular disc. Various layers surround the former and each is concentric around the former in cross-section. Each layer is itself therefore a tube with a torus-shaped outer surface, as it follows the shape of the former.

Starting from the layer closest to the former, and moving radially outwards from the former in cross-section, the layers are: the coil winding, an inner insulation, an inner screen, an intermediate insulation, an outer screen and an outer insulation. The insulations therefore separate the coil winding, the inner screen and the outer screen. Each layer surrounds the layers inside it and is surrounded by the layers outside it. Adjacent layers are in contact with each other. The layers are consistently arranged in cross-section along the whole former.

The former is a non-magnetic material, in these embodiments polytetrafluoroethylene (PTFE). The former is capable of being bent into a loop.

The coil winding is loosely spaced, as shown in FIG. 9, to give a relatively low inductance. The coil winding has a substantially constant turns density.

The dielectric between the coil and the inner screen (i.e. the inner insulation) has a low permittivity so as to minimise the capacitance between the coil and the inner screen. The inner insulation is a plastic tube of PTFE. It closely fits over the coil. The intermediate insulation and the outer insulation are formed of respective layers of heat-shrink.

The inner screen is a helical screen, as shown in FIG. 7 and described above. The copper strip is bonded to the dielectric material (i.e. to the inner insulation) with adhesive.

The capacitance between the inner and outer screens has little effect on the behaviour of the transducer. Consequently, the outer screen diameter need not be much larger than the inner screen diameter. Having a relatively large inner screen diameter has the advantage of reducing the Rogowski coil capacitance.

The outer screen is a braid screen as shown in FIG. 8 and described above. The braid can be inserted as a sleeve around the dielectric (i.e. the intermediate insulation) and axially stretched to provide a relatively close fit on the dielectric. The braid is then surrounded by the outer insulation.

In some embodiments, the braid screen comprises insulated braid (such as enamel). In some embodiments, there is no intermediate insulation—the inner screen and the outer screen are adjacent layers.

Figure 10:
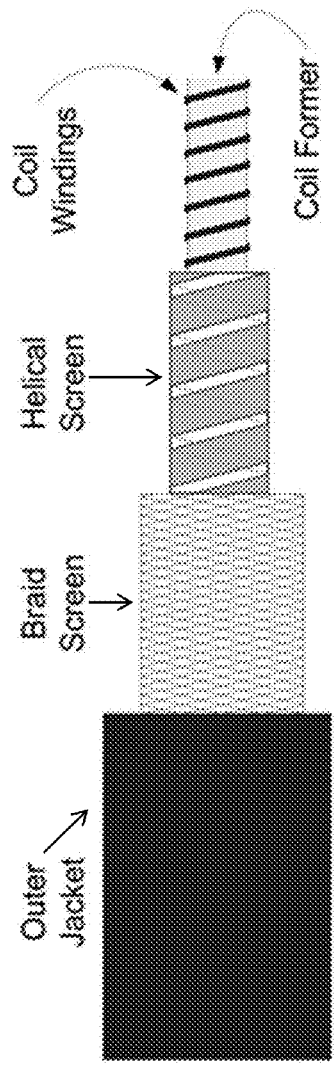
FIG. 10 is another view of the Rogowski coil of FIG. 9 showing the helical inner screen and the braid outer screen.

FIG. 10 is a picture of the Rogowski coil sectioned to show the coil winding, the inner screen (helical) and the outer screen (braid). The complete length of coil is positioned in a loop around the current to be measured as shown in FIG. 1.

Figure 11:
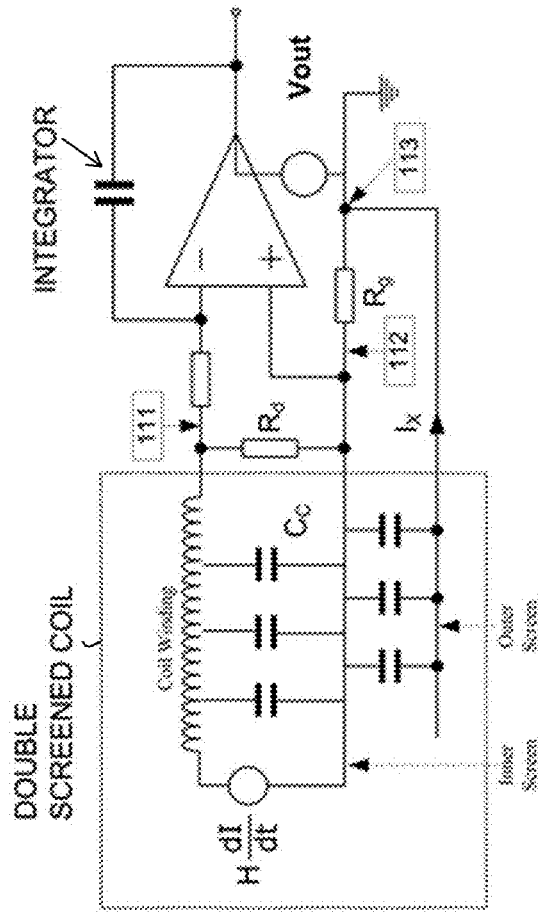
FIG. 11 shows an equivalent circuit for the Rogowski coil of FIG. 9 and its connection to an integrator.

FIG. 11 shows the connections between the coil and the integrator. The coil is represented by an equivalent circuit in which H·dI/dt represents the induced voltage due to the current being measured. One end of the coil winding (generally the fixed end as shown in FIG. 1) is connected to the integrator input 111 and the other end (the free end) is connected to the inner screen at that end. The inner screen constitutes the return path and since the winding and the screen are concentric, there is no net magnetic loop in the plane of the coil and hence no interference from external currents. The fixed end of the screen is then connected to the common input of the integrator 112 as shown.

The outer screen is connected at the fixed end to the integrator output terminal 113 which should be externally grounded.

The coil has distributed capacitance $C_c$ as shown. The coil bandwidth is approximately given by $$f_B = 1/\sqrt{2\pi \cdot L C_c} \qquad (6)$$

where L is the coil inductance. There is also distributed capacitance as shown between the inner and outer screens but this does not substantially affect the coil bandwidth. Equation (6) should be compared with equation (5), which illustrates a further advantage of the doubly screened coil.

The single screen circuit of FIGS. 5 and 6 has interaction between the coil inductance L and both the distributed capacitances $C_c$ and $C_s$. This results in two possible major modes of resonance and it is difficult to find a suitable value for the damping resistor $R_d$ to adequately damp both modes. The coil of FIG. 11 has only one major mode of resonance and the appropriate value for $R_d$ is approximately $\sqrt{(L/C_c)}$.

The doubly screened coil of FIG. 11 also provides better screening than the single screened coil. Any interference current which penetrates the outer screen will be collected by the inner screen and very largely flow to ground, by-passing the integrator. In practice, the helically wound inner screen will have some impedance and as a result some of the displacement current may pass via the coil free end and the coil winding to the input of the integrator. However, the proportion of the interference current taking this path will be very small and the doubly screened coil gives enhanced protection from interference compared with the single screened coil.

Figure 12:
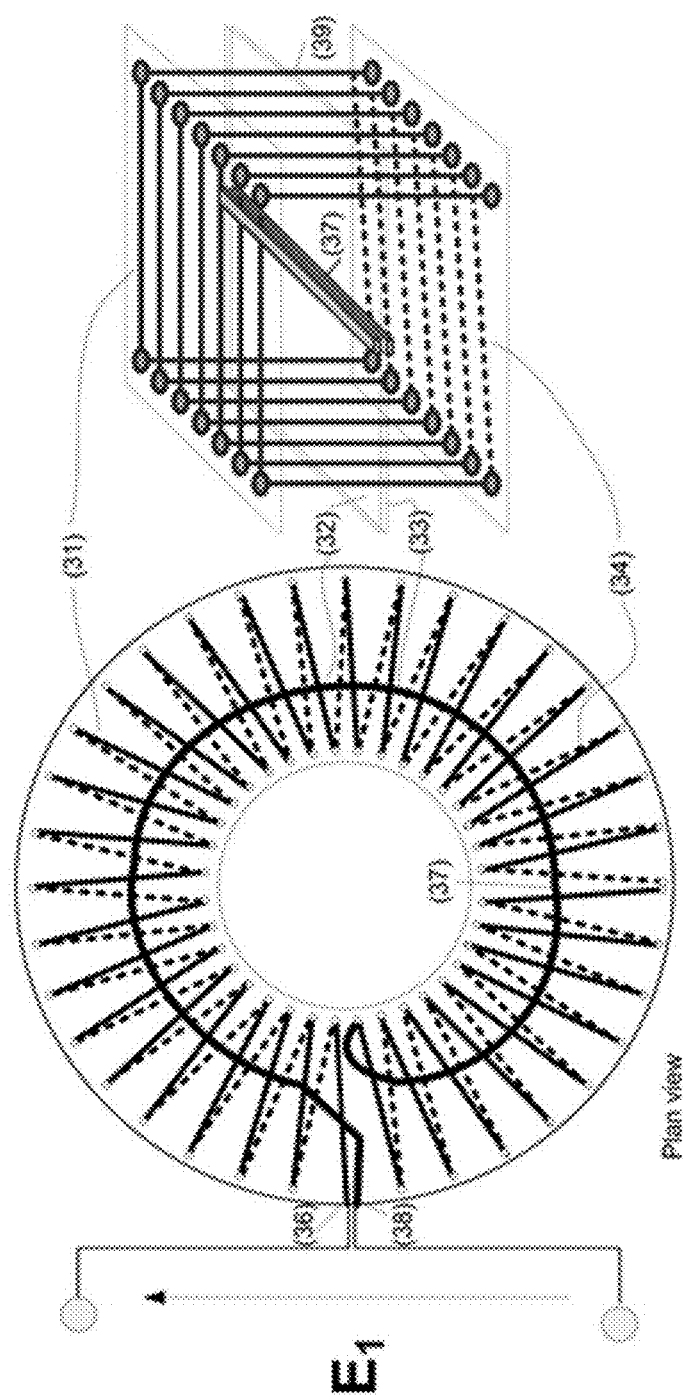
FIG. 12 shows a Rogowski coil implemented on a multilayer PCB and showing the return conductor.
Figure 13:
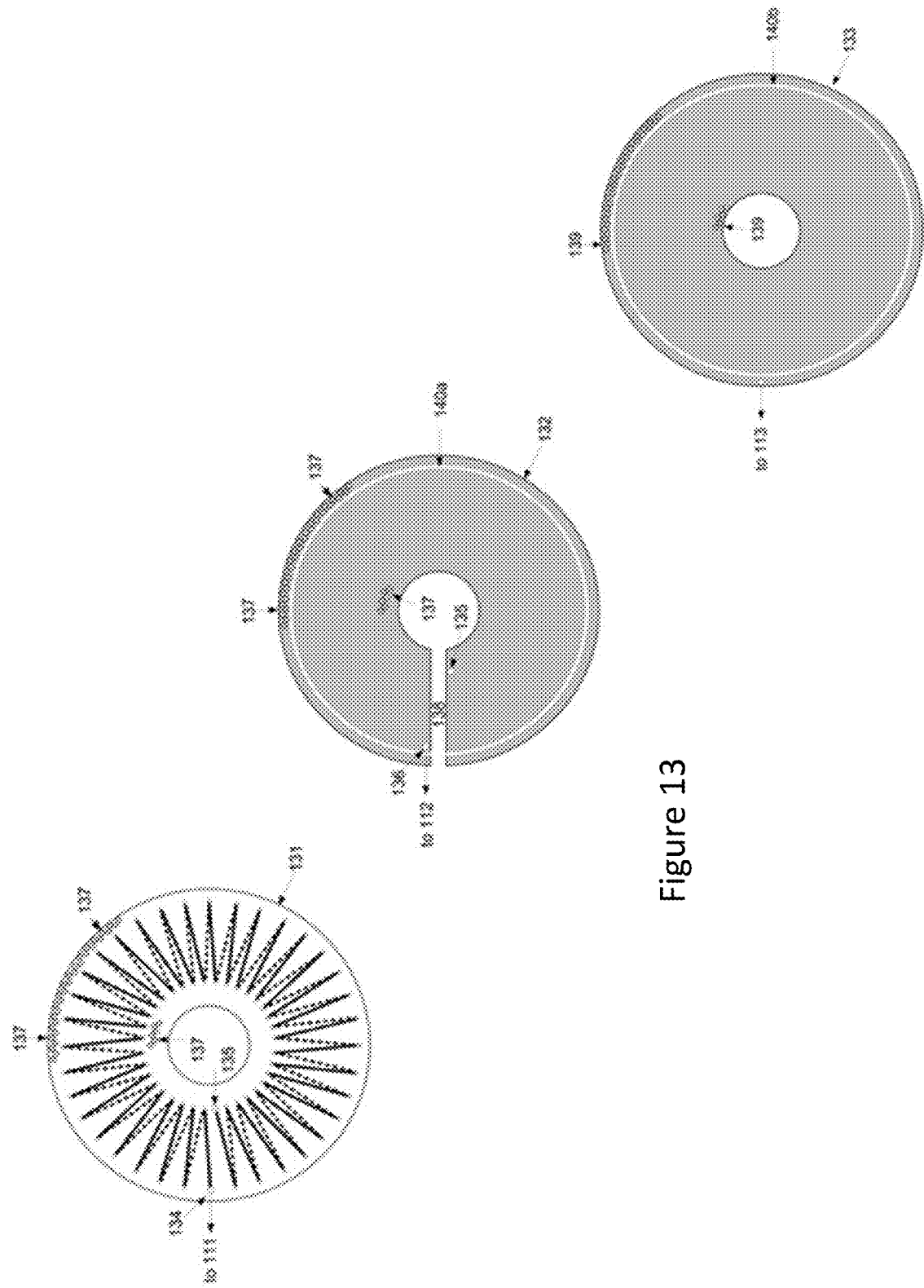
FIG. 13 shows plan views of a Rogowski coil such as in FIG. 12 and the associated electrostatic screens.
Figure 14:
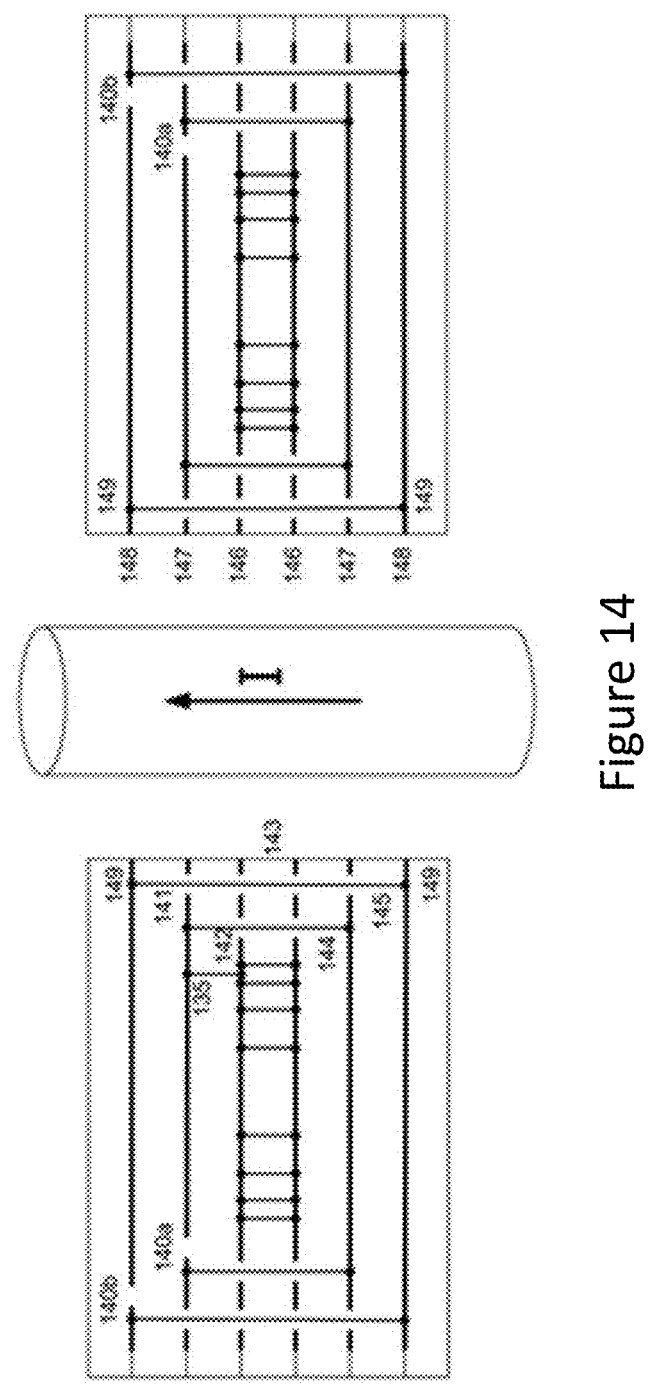
FIG. 14 is a cross section view of the Rogowski coil and screens shown in FIG. 13 and showing the PCB layers.

A further embodiment is illustrated in FIGS. 12 to 14. This embodiment comprises an alternative form of Rogowski coil known as a printed circuit coil for which the coil loop is permanently closed (generally called a fixed coil) and for which the coil cross section is rectangular. This type of coil is described, for example, in "Rogowski Coil" Patent JP2001102230 Filed 29.09.99 Published 13.04.2001, by O Akira & I Satoru, which is incorporated by reference herein.

FIG. 12 shows a typical printed circuit Rogowski coil. For this type of coil, a printed circuit board is generally used for the coil former and each coil turn comprises printed circuit strips on the surface of the board together with plated though-holes joining the strips so as to make coil turns as shown. The coil is connected to an integrator such as shown schematically in FIG. 1 and the principle of the current measurement is the same as defined by equations (1) to (3). Other arrangements of printed circuit Rogowski coils may be used.

A four layer PCB is used in FIG. 12, wherein the PCB has first 31, second 32, third 33 and fourth 34 surfaces as shown. Conductive strips are deposited or etched on the outer (first 31 and fourth 34) surfaces using known photo-resistive processes. These strips are connected by plated through holes 39 to form a helical coil (of rectangular cross-section) which proceeds in a first direction around the substrate.

A return conductor 37, which proceeds in an opposite direction to the coil, is deposited on the inner (second 32 and third 33) surfaces. The coil and return conductor 37 are connected to provide a 'go and return' path to minimise the influence of conductors outside the Rogowski coil as explained above. The coil ends 36 and 38 are connected to the integrator inputs as shown in FIG. 1.

FIGS. 13 and 14 illustrate an alternative embodiment to the PCB Rogowski coil embodiment shown in FIG. 12. The difference between this alternative embodiment and the embodiment of FIG. 12 is that the return conductor 37 is not required and two screens are added. The screens comprise layers of thin copper deposited on layers within the PCB, as shown in FIG. 14.

FIG. 13 shows a printed circuit coil 131, one side of an inner screen 132 and one side of an outer screen 133. These are shown alongside each-other for clarity although they actually lie one inside the other, as shown in FIG. 14. Both sides of the inner screen and the outer screen are the same except for a circular gap in the copper layer to prevent the screen acting as a shorted turn around the coil. For this embodiment the coil is the same as that shown in FIG. 12 with one end 134 connected to a first integrator input 111 as in FIG. 11. The coil progresses in a clockwise direction and ends at the plated through hole 135 which connects the end of the coil to the inner screen as shown in FIG. 14.

The inner screen 132 forms the return path for the coil, which progresses in a counter-clockwise direction to the output terminal 136, which is connected to a second integrator input 112, as in FIG. 11. It will be seen that there is a gap 138 on both sides of the inner screen 132 so as to constitute a start 135 and a finish 136 to the return path.

The two sides of the inner screen are connected together using other plated through holes 137. Some of the through holes 137 are situated proximal to the centre of the inner screen 132 in an inner circular arrangement of substantially constant radius, and the remaining through holes 137 are situated radially further from the centre, proximal to the outer circumference of the inner screen 132, in an outer circular arrangement of substantially constant radius. These through holes 137 are in close proximity to each other and are staggered as shown to provide effectively a complete screen without gaps around the coil. For simplicity only a limited number of these holes are shown in FIG. 13 but in practice they would continue all around to form the inner and outer circular arrangements.

The inner screen 132 for this embodiment is concentric with the coil and has substantially the same radial dimensions as the coil. To prevent the inner screen 132 acting as a shorted turn around the coil, a circular gap 140a is included. This is only required on one side of the screen, as shown in FIG. 14.

FIG. 13 also shows one side of the outer screen 133. The two sides of the outer screen are connected together using more plated through holes 139 situated in the same manner as the through holes 137, but the inner circular arrangement of the through holes 139 is radially closer to the centre than the inner circular arrangement of the through holes 137, and the outer circular arrangement of the through holes 139 is radially further from the centre than the outer circular arrangement of the through holes 137. As for the inner screen 132, the through holes 139 are in close proximity to each other and are staggered as shown to provide effectively a complete screen without gaps around the inner screen. As for the through holes 137, for simplicity only a limited number of these holes are shown in FIG. 13.

The outer screen 133 for this embodiment is also concentric with the coil and extends both radially closer to the coil and radially further from the coil than the inner screen 132. As for the inner screen 132, to prevent the outer screen 133 acting as a shorted turn around the coil, a circular gap 140b is included. This is only required on one side of the screen, as shown in FIG. 14.

There is no plated through hole connection between the outer screen 133 and either the inner screen 132 or the coil. The outer screen is connected to the grounded output of the integrator 113 as shown in FIG. 11.

FIG. 14 shows a cross section of the assembly showing the printed circuit board with five layers, 141, 142, 143, 144 and 145. The printed circuit coil comprises strips deposited on layer 143 with plated through holes connecting the strips to form coil turns as explained above. FIG. 14 only shows a limited number of plated through holes for illustrative purposes and is not intended to represent an accurate cross-sectional drawing of the assembly. It will be appreciated that FIG. 14 is not drawn to scale and that in practice the diameter of the printed circuit coil is generally very much greater than the board thickness.

The inner screen 147 is deposited on layers 142 and 144 and the outer screen 148 on layers 141 and 145. Only four plated through holes for each screen are shown connecting the two sides of the screen, two radially distal from the centre and two radially proximal to the centre. This is to illustrate the multi-layer assembly without the complexity of all the plated through holes. However, FIG. 14 does show the circular gaps 140a and 140b referred to above.

The board may be covered with insulation 149 for protective purposes. The conductor carrying the current I to be measured is situated in the circular aperture in the centre of the board as shown. The conductor may be surrounded by an additional cylindrical shield which is grounded to provide extra immunity to the coil from interference due to high voltages on the conductor. This additional shield has not been shown for simplicity.

In a further embodiment, the inner screen is replaced by a printed circuit coil such as shown in FIG. 13 but wound in the opposite direction to the inner coil and with printed circuit strips that only have a small gap between adjacent strips.

It will be understood that the above description of specific embodiments is by way of example only and is not intended to limit the scope of the present disclosure. Many modifications of the described embodiments, some of which are now described, are envisaged and intended to be within the scope of the present disclosure.

In some embodiments, a bifilar coil winding is used, with the two windings connected in parallel to minimise the coil resistance.

In some embodiments, heat-shrink is used for the dielectric between the coil and the inner screen (i.e. the inner insulation) instead of the material described above. The heat-shrink material is inserted as a sleeve around the coil and then shrunk to make a tight fit by applying hot air. In some embodiments, the intermediate insulation and/or the outer insulation are formed with this material and in this manner. In some embodiments, the insulations are formed of different materials and/or in different manners. In some embodiments, the intermediate insulation and/or the outer insulation are formed of PTFE.

In some embodiments, the inner and outer screens are different types of screens from those specified above. They may be the same as each other or different from each other. Helical or braided or snail type screens may be used for either outer or inner screens.

In some embodiments, instead of a simple inverting integrator circuit, a non-inverting integrator circuit or a digital integrator is used.

In some embodiments, one or more of the components above is made of other suitable material.

In some embodiments, the former is magnetic. In some embodiments, the former is a plastic other than PTFE.

The invention claimed is:

1. A current measuring device comprising:
   an electrically conductive coil having a first end and a second end;
   a first screen surrounding the coil and arranged to provide a current path from the second end of the coil to a location proximal to the first end of the coil, wherein a first end of the first screen is proximal to the first end of the coil, and a second end of the first screen is proximal to and electrically connected to the second end of the coil;
   a second screen surrounding the first screen and the coil; and
   an electrical integrator having a first input terminal, a second input terminal, and an output terminal, wherein the first input terminal is electrically connected to the first end of the coil, the second input terminal is electrically connected to the first end of the first screen, and wherein the output terminal provides an integrator output with respect to a ground to which the second screen is electrically connected.

2. The current measuring device as claimed in claim 1, wherein the coil forms a loop, with the first end being located proximal to the second end.

3. The current measuring device as claimed in claim 2, wherein the loop is opened or openable to form a gap between the first end and the second end.

4. The current measuring device as claimed in claim 1, wherein the conductive coil comprises a Rogowski coil.

5. The current measuring device as claimed in claim 4, wherein the Rogowski coil comprises any of: a clip-around coil, a closed-loop coil, a printed circuit Rogowski coil and a coil wound on a non-conductive former.

6. The current measuring device as claimed in claim 1, wherein the second screen is electrically insulated from the first screen and the coil.

7. The current measuring device as claimed in claim 1, wherein at least one of the first screen and the second screen is an electrostatic screen.

8. The current measuring device as claimed in claim 1, wherein at least one of the first screen and the second screen is arranged to reduce capacitive coupling from external conductors to the coil.

9. The current measuring device as claimed in claim 1, further comprising a former, around which the coil is situated.

10. The current measuring device as claimed in claim 1, wherein the electrical integrator is arranged to provide an output voltage that is substantially proportional to an integral with respect to time of a voltage between the first end of the conductive coil and a first end of the first screen.

11. The current measuring device as claimed in claim 1, wherein an electrical resistance exists between the second input of the electrical integrator and the ground to which the second screen is electrically connected.

* * * * *